Feb. 6, 1968 B. E. OLSSON 3,368,188

WIRE GRIP CIRCUIT BOARD EYELET

Filed Nov. 14, 1966

INVENTOR
BILLY E. OLSSON

BY Whittemore, Hulbert & Belknap
ATTORNEY 3,368,188

WIRE GRIP CIRCUIT BOARD EYELET

Billy E. Olsson, New Cumberland, Pa., assignor to Berg Electronics, Inc., New Cumberland, Pa., a corporation of Pennsylvania Filed Nov. 14, 1966, Ser. No. 593,884
7 Claims. (Cl. 339—275)

ABSTRACT OF THE DISCLOSURE

This invention relates to a wire grip eyelet and has particular reference to an electric connector type eyelet for insertion in a hole formed in a circuit board whereby lead wires inserted into the eyelet are positively held in position on the circuit board during solder dipping of the circuit board. The invention is especially useful for securing lead wires to the miniaturized circuit board assembly as used in today's electronic industry. By using an eyelet according to the invention a compact and reliable solder connection is established between the printed circuitry on the circuit board and the lead wires held by the eyelets.

Conventional connectors used for holding lead wires to a circuit board during a soldering step, as illustrated in U.S. Letters Patent Nos. 3,060,402 and 3,156,517 utilize a solder well type construction which projects from the circuit board a considerable distance on the side away from the circuit elements. As illustrated in the aforementioned patents, this distance may be equal to several times the thickness of the circuit board. Use of the conventional solder well type terminals for holding lead wires requires that the bottom surface of the circuit board be spaced from the adjacent circuitry or chassis a distance sufficient to allow clearance for the solder well terminals.

In contrast to the conventional solder well type terminal, the invention provides a compact circuit board eyelet which is essentially flush with the bottom of the circuit board so as to reduce the required spacing distance between the circuit board and the rest of the circuit. The resultant saving of space is important in an industry which is constantly striving to reduce the size of circuits. The invention is also cheaper to manufacture than the conventional solder well terminals and assures that a positive electrical solder joint is formed between the lead wires and the circuit board.

A primary object of the invention is to provide a new and improved eyelet for holding lead wires to a circuit board.

Another object of the invention is to provide a circuit board eyelet which permits closer spacing of circuit boards than heretofore possible.

A further object of the invention is to provide a compact circuit board eyelet for holding lead wires on a circuit board during a solder dipping operation and having a thickness not substantially greater than the circuit board upon which it is mounted.

A still further object of the invention is to provide a circuit board eyelet having improved solder flow characteristics to insure that upon solder dipping of one side of the circuit board, solder flows through the body of the eyelet and to each side of the circuit board, thereby assuring that a positive solder connection is established between the eyelet, the wires held therein, and each side of the circuit board.

Other objects and features of the invention will become apparent as the description proceeds, especially when taken in conjunction with the accompanying drawings illustrating a preferred embodiment of the invention, wherein.

Figures 1, 2, 3, 4, 5, 6:
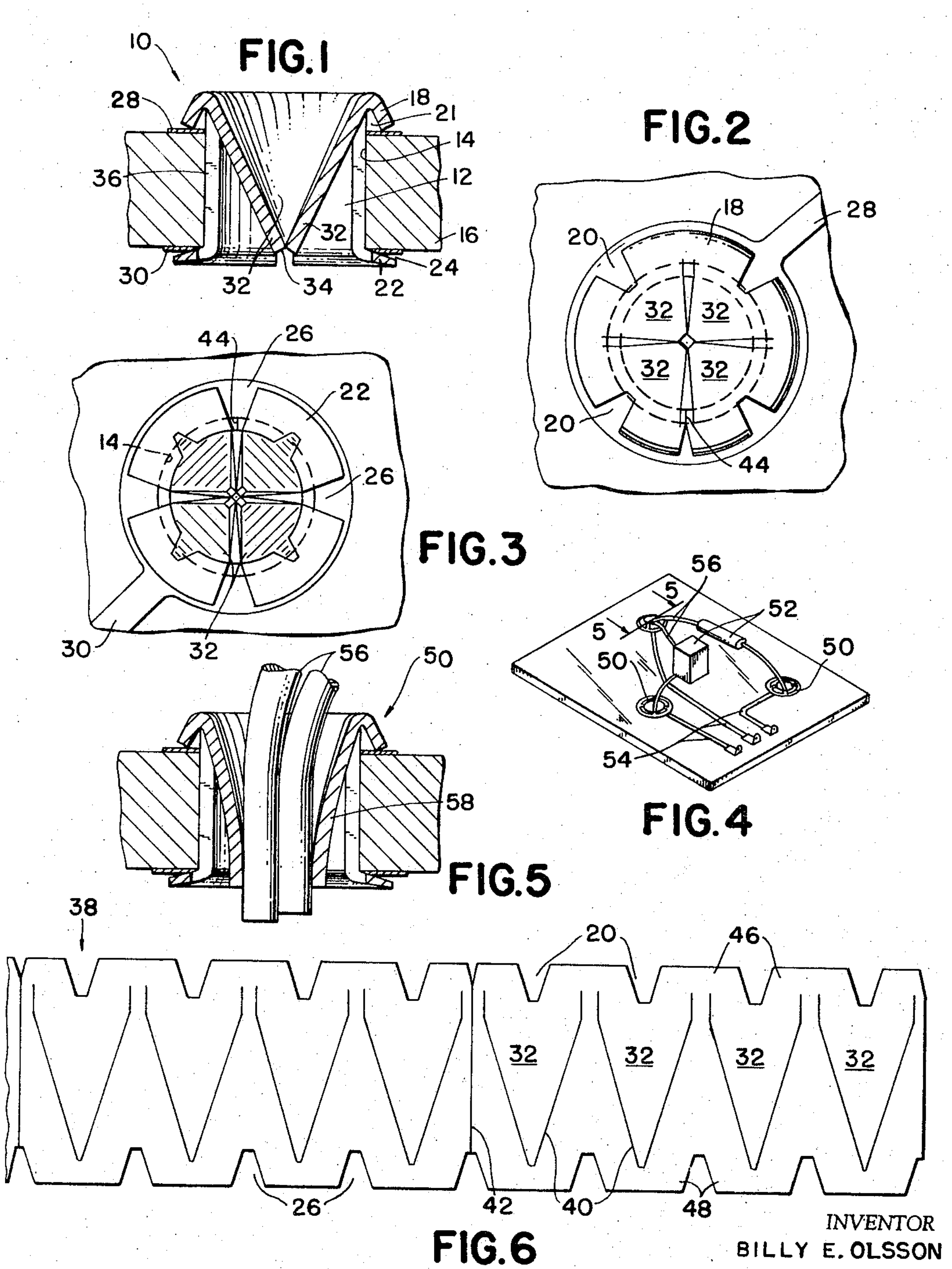
FIGURE 1 is a sectional view showing an eyelet according to the invention on a circuit board.
FIGURE 2 is a top view of FIGURE 1.
FIGURE 3 is a bottom view of FIGURE 1.
FIGURE 4 is a perspective view of a circuit board utilizing eyelets as described.
FIGURE 5 is a view taken along line 5—5 of FIGURE 4.
FIGURE 6 shows a strip of metal from which the eyelet may be formed.

As illustrated in the drawings, the invention comprises a circuit board eyelet 10 having a cylindrical body portion 12 fitted within a cylindrical eyelet hole 14 formed in circuit board 16. The body portion 12 extends upwardly past the upper surface of the circuit board and is provided with a reverse bend flange 18 at the upper end thereof. The flange 18 extends around the circumference of the eyelet and is provided with spaced notches 20 which facilitate the manufacture of the eyelet and also permit improved solder flow during solder dipping of the circuit board. The free end of the flange 18 engages the upper surface of the circuit board 16 at a distance away from the eyelet hole 14 to provide a solder flow area 21 defined between the circuit board, the eyelet body, and the flange 18.

The lower end of the eyelet body 12 extends downwardly to the lower surface of the circuit board 16 and is provided with an outwardly bent flange 22 which extends around the circumference of the eyelets. Flange 22 engages the bottom surface of the circuit board adjacent the eyelet hole so as to cooperate with the flange 18 in holding the eyelet on the circuit board. Outwardly of the hole 14, flange 22 diverges from the bottom surface of the circuit board to form a solder recess 24 between the circuit board and the flange. The lower flange is provided with a plurality of circumferentially spaced radial notches 26. As illustrated in FIGURES 2 and 3, the notches 20 in flange 18 are circumferentially positioned between the notches 26 in the flange 22.

Both the upper and lower surfaces of the printed circuit board 16 may be provided with copper printed circuit paths 28 and 30 which surround each end of the eyelet hole 14. When printed circuit paths are provided, the eyelet flanges 18 and 22 are brought into contact with the printed circuit paths in order to insure that a reliable electrical connection is established therebetween when the circuit board is solder dipped.

A plurality of essentially flat resilient solder grip fingers 32 are struck from the body portion of the eyelet and are secured thereto at the upper end of the eyelet. The fingers are triangular in shape and project downwardly into the interior of the eyelet and toward the axis thereof so that the ends of the fingers meet at a point 34 adjacent the lower end of the body portion 12. The cutout portions 36 formed in the body of the eyelet 12 when the fingers are struck therefrom provide solder flow openings from the interior of the eyelet to the solder flow area 21 so that upon solder dipping of the lower surface of the circuit board, solder flows by capillary action into the interior of the eyelet, through openings 36 in the side wall thereof, and to the solder flow area 21 to establish a reliable solder connection between the printed circuit path 28 and the eyelet.

A circuit board eyelet 10 may be formed from metal strip 38 as shown in FIGURE 6. Strip 38 is of indefinite length and has been punch formed to provide the staggered notches 20 and 26 on the lateral edges thereof. The strip is cut along lines 40 to form fingers 32 which extend transversely across the strip 38. The length of the fingers 32 is greater than the height of the cylindrical eyelet body 12 so as to assure maximum finger length and flexibility in the eyelet.

Eyelets 10 are formed from the strip 38 by severing the strip at 42 so as to remove from the remainder of the strip a portion sufficient to form one eyelet. The fingers 32 are bent outwardly of the strip and the severed portion is then rolled to form the cylindrical eyelet body portion 12 with the ends of the strip portion abutting each other at 44 as shown in FIGURES 2 and 3. When the eyelet portion is rolled to form the cylindrical body, the bent-out fingers 32 are brought into contact against each other as in FIGURE 1. The fingers may be originally bent from the strip through an angle slightly greater than that shown in FIGURE 1 so that as the strip portion is rolled into a cylindrical shape and the fingers are brought together they are bent back toward the side wall 12 somewhat so that each finger is resiliently biased toward and held against the other fingers. In this way it is possible to prestress the fingers 32 so that when a lead wire is inserted into the eyelet, the fingers positively grip the wire for holding the same in position during solder dipping of the circuit board.

Following rolling of the eyelet, the reverse bend flange 18 is formed by bending the tabs 46 back away from the eyelet and through an angle greater than 90°. The eyelet may then be inserted into a circuit board eyelet hole and the lower tabs 48 thereof may then be bent outwardly of the eyelet hole 14 to secure the eyelet to the circuit board. The circuit board eyelet may be formed from a strip of ¾ hard brass, phosphor bronze, or other suitable material.

FIGURE 4 illustrates a circuit board with three circuit board eyelets 50 attached thereto for connecting the lead wires of circuit elements 52 to the printed circuitry 54. When lead wires 56 are inserted into the eyelets 50, the flat wire grip fingers 58 are forced apart and are bent throughout their length as shown. The resiliency of the fingers 58 permits each eyelet to grip and hold a plurality of lead wires in position on the circuit board. Because the wire grip fingers are flat, they are elastically deformed upon insertion of the lead wires and can hold a greater number of lead wires to the circuit board than other wire holding connectors.

During solder dipping of the circuit board the hot solder flows by capillary action up into the interior of the eyelet and through the openings formed in the side walls when the fingers are punched therefrom to the solder flow area beneath the reverse bend flange. Solder also flows into the solder recess 24 adjacent the bottom surface of the circuit board. Thus a complete and reliable solder connection is formed between the lead wires and the circuit paths on both sides of the circuit board.

While I have illustrated and described a preferred embodiment of my invention, it is understood that this is capable of modification. For example, although the drawings show an eyelet having four wire grip fingers, it is intended that the invention not be limited to four finger eyelets. While I have found that it is preferable to use the four fingers construction, an eyelet according to the invention may have three, four, five, or any greater number of wire gripping fingers. I therefore do not wish to be limited to the precise details set forth, but desire to avail myself of such changes and alterations as fall within the purview of the following claims.

What I claim as my invention is:

1. A wire grip circuit board eyelet for holding a lead wire in position on a circuit board during a soldering operation comprising: a hollow body fitted snugly within an eyelet hole extending through the circuit board, the cross section of the hollow body conforming to the cross section of the eyelet hole, the length of said body being greater than the thickness of the circuit board so that the body projects from one side of the circuit board and one end thereof is located outwardly from such side, first circuit board stop means located on said one end of said body and extending toward and engaging said one side of the circuit board outwardly of said body, second circuit board stop means on the other end of said body for engaging the other side of the circuit board, a plurality of wire grip fingers formed from said body and connected to said first stop means outwardly of the circuit board adjacent said one body end, said fingers being spaced around said one body end and extending into the eyelet hole in converging relation with the free ends thereof grouped together adjacent the other end of said body whereby upon insertion of a lead wire into the eyelet the fingers are bent apart and resiliently grip the wire.

2. An eyelet as in claim 1 wherein said first stop means includes a flange extending around said one end of said body, the free end of said flange engaging the one side of the circuit board at a distance from said body to define a solder flow area between the inner surface of said flange, the outer surface of said body, and said one side of the circuit board, and a solder flow opening in said body communicating the interior of the body with said solder flow area whereby upon solder dipping of the other side of the circuit board solder flows by capillary action into the interior of the body, around said fingers, and through the solder flow opening into the solder flow area.

3. An eyelet as in claim 2 wherein a plurality of solder flow openings are provided in said body and said fingers are punched out of said body to form cut-out portions therein which define said solder flow openings.

4. An eyelet as in claim 3 provided with four triangularly shaped and essentially planar wire grip fingers, and wherein said body is circular in cross section.

5. An eyelet as in claim 4 wherein said second circuit board stop means comprises a second flange extending around the other end of said body and being bent away from said eyelet hole, such flange engaging the other side of the circuit board adjacent the eyelet hole and diverging away from such side away from the eyelet hole to define a solder recess between said second flange and the circuit board whereby upon solder dipping of the circuit board solder flows into said recess.

6. An eyelet as in claim 5 wherein a plurality of circumferentially spaced cut-out notches are provided around each of said first and second flanges.

7. An eyelet as in claim 6 wherein four notches are provided in each of said first and second flanges, the notches in said second flange being circumferentially spaced between the notches in said first flange.

References Cited

UNITED STATES PATENTS

| | | | |
|---|---|---|---|
| 3,060,402 | 10/1962 | Olsson et al. | 339—275 |
| 3,156,517 | 11/1964 | Maximoff et al. | 339—275 |
| 3,190,953 | 6/1965 | Keller | 339—275 |

MARVIN A. CHAMPION, *Primary Examiner.*

R. S. STROBEL, *Assistant Examiner.*